(12) United States Patent
Denham et al.

(10) Patent No.: US 9,647,655 B2
(45) Date of Patent: May 9, 2017

(54) CURRENT TO FREQUENCY CONVERTER

(71) Applicant: RAYTHEON COMPANY, Waltham, MA (US)

(72) Inventors: Martin S. Denham, Bend, OR (US); Bruce E. Bozovich, Northridge, CA (US)

(73) Assignee: RAYTHEON COMPANY, Waltham, MA (US)

( * ) Notice: Subject to any disclaimer, the term of this patent is extended or adjusted under 35 U.S.C. 154(b) by 222 days.

(21) Appl. No.: 14/670,628

(22) Filed: Mar. 27, 2015

(65) Prior Publication Data

US 2016/0285444 A1 Sep. 29, 2016

(51) Int. Cl.
  *H03K 7/06* (2006.01)
  *H04N 5/3745* (2011.01)
  *H04N 5/357* (2011.01)

(52) U.S. Cl.
  CPC .............. *H03K 7/06* (2013.01); *H04N 5/357* (2013.01); *H04N 5/37455* (2013.01)

(58) Field of Classification Search
  CPC ...... H03K 7/06; H04N 5/37455; H04N 5/335; H01L 27/00
  USPC ...................................................... 250/214.1
  See application file for complete search history.

(56) References Cited

U.S. PATENT DOCUMENTS

| 4,999,528 | A | * | 3/1991 | Keech | .................. | H03K 3/0375 |
| | | | | | | 326/94 |
| 5,999,029 | A | * | 12/1999 | Nguyen | ............... | H03K 3/0375 |
| | | | | | | 326/94 |
| 6,333,656 | B1 | * | 12/2001 | Schober | .............. | H01L 27/0207 |
| | | | | | | 327/202 |
| 7,009,367 | B1 | | 3/2006 | Sakurai | | |
| 7,244,919 | B2 | * | 7/2007 | Ishikawa | ................ | H04N 5/335 |
| | | | | | | 250/208.1 |
| 7,326,903 | B2 | * | 2/2008 | Ackland | .............. | H04N 5/3559 |
| | | | | | | 250/208.1 |
| 8,116,120 | B2 | * | 2/2012 | Lin | ...................... | G11C 7/1051 |
| | | | | | | 365/154 |
| 8,519,879 | B1 | | 8/2013 | Denham | | |

(Continued)

FOREIGN PATENT DOCUMENTS

EP 0967794 A1 12/1999
WO 2013015853 A2 1/2013

OTHER PUBLICATIONS

Notification of Transmittal of the International Search Report and the Written Opinion of the International Searching Authority from corresponding PCT/US2015/062891 dated Aug. 19, 2016.

*Primary Examiner* — Seung C Sohn
(74) *Attorney, Agent, or Firm* — Lando & Anastasi, LLP

(57) ABSTRACT

According to one aspect, embodiments herein provide a current to frequency converter comprising a node configured to be coupled to a photodetector and to receive a photo-current from the photodetector, a capacitor having a first terminal and a second terminal and configured to accumulate electrical charge derived from the photo-current on the first terminal and the second terminal, a switch network configured to selectively couple one of the first terminal and the second terminal to the node, and a Master-Slave (MS) Flip Flop (FF) coupled to the switch network and configured to operate the switch network to toggle which of the first terminal and the second terminal is coupled to the node based on a voltage at the node.

18 Claims, 4 Drawing Sheets

(56) References Cited

U.S. PATENT DOCUMENTS

| 8,604,774 B2* | 12/2013 | Hsu ........................... G01J 1/46 |
| | | 324/658 |
| 8,779,342 B2 | 7/2014 | Denham |
| 2008/0180112 A1 | 7/2008 | Lauxtermann |
| 2013/0278804 A1 | 10/2013 | Denham et al. |
| 2014/0146180 A1 | 5/2014 | Denham |

* cited by examiner

US 9,647,655 B2

CURRENT TO FREQUENCY CONVERTER

FEDERALLY SPONSORED RESEARCH

This invention was made with U.S. government support under Contract No. N66001-12-C-2010 awarded by SPAWAR Systems Center Pacific. The U.S. government has certain rights in this invention.

BACKGROUND

A focal plane array typically includes a two-dimensional array of detector elements, or pixels, organized by columns and rows. It is common for a circuit or imager within a pixel to accumulate charge from a photo-diode, the charge corresponding to the flux of light of various wavelengths incident on the photo-diode. Often, the charge is accumulated on a capacitive element which effectively integrates charge, producing a voltage that corresponds to the intensity of the flux over a given time interval called an integration interval.

In a traditional analog pixel, a well capacitor is coupled to a detector diode. The well capacitor integrates photo-current from the detector diode over an integration interval. Once per frame, the voltage on the well capacitor is transferred to a sample-and-hold capacitor and then transferred out, line by line, to an Analog to Digital Converter (ADC) which converts the voltage to a binary value. However, as pixel sizes have decreased, the ability of the well capacitor to store an effective amount of charge has diminished.

In-pixel ADC imaging offers improved photo-charge capacity even as the desired size of pixels continues to shrink (e.g., below 15 microns). A traditional in-pixel ADC design includes a quantizing analog front end circuit which accumulates charge over a relatively small capacitor and is reset (i.e., discharged) each time a threshold charge is stored on the capacitor. The pattern of charging and resetting is repeated as more photo-current integrates. Each reset event is "accumulated" (i.e., counted) with a digital counter circuit. Each frame, a global snapshot is taken by copying the digital counter contents to a snapshot register and then reading the snapshot registers out, line by line. The effect is to exponentially increase well capacity of the imager while maintaining a relatively small pixel size.

SUMMARY

A self-referencing current to frequency converter using a switched capacitor is provided that leverages the faster gate speeds of deep submicron CMOS to its advantage. The current to frequency converter uses the master of a Master-Slave (MS) Flip Flop (FF) and a DPDT switch network to control an integration capacitor's polarity. At each crossing of a reference charge level on the capacitor, the MS FF toggles and flips the DPDT switch network, thereby reversing both terminals of the integration capacitor which in turn returns the DPDT switch network to its nominally stable integration condition. By automatically reversing the integration capacitor when the reference charge level is crossed, standard reset mechanisms used in the current-to-frequency production of typical in-pixel imagers are not required and the problems associated with reset pulse widths and reset noise are eliminated. In fact, increasing the gate speed of the current to frequency converter actually improves the performance of the converter. In addition, there is no reset associated discharge current and the circuit continues to integrate during the switching event.

Aspects and embodiments are directed to a current to frequency converter comprising a node configured to be coupled to a photodetector and to receive a photo-current from the photodetector, a capacitor having a first terminal and a second terminal and configured to accumulate electrical charge derived from the photo-current on the first terminal and the second terminal, a switch network configured to selectively couple one of the first terminal and the second terminal to the node, and a Master-Slave (MS) Flip Flop (FF) coupled to the switch network and configured to operate the switch network to toggle which of the first terminal and the second terminal is coupled to the node based on a voltage at the node.

According to one embodiment, the current to frequency converter further comprises a voltage reference configured to generate a first reference voltage, and a comparator coupled to the node, the voltage reference, and the MS FF, wherein the comparator is configured to compare the voltage at the node with the first reference voltage, provide an output signal at a first level to the MS FF in response to a determination that the voltage at the node exceeds the first reference voltage, and provide the output signal at a second level to the MS FF in response to a determination that the voltage at the node is less than the first reference voltage. In another embodiment, the current to frequency converter further comprises a buffer coupled between the comparator and the MS FF.

According to another embodiment, the MS FF comprises a first latch having an enable input and a latch output, the enable input coupled to the comparator, a second latch having an inverted enable input coupled to the comparator and a latch output coupled to a data input of the first latch and to the switch network, and a first inverter coupled between the latch output of the first latch and a data input of the second latch, wherein the second latch is configured to generate a pulse signal at its latch output based on the output signal received from the comparator, the pulse signal having a frequency corresponding to an intensity of light incident on the photodetector.

According to one embodiment, the current to frequency converter further comprises a reset switch coupled between the node and the voltage reference and configured to be coupled to a controller via a reset line, wherein the voltage reference is further configured to generate a second reference voltage, and wherein the reset switch is further configured to selectively couple the node to the second reference voltage in a reset mode of operation. In one embodiment, in response to receiving the output signal at the first level from the comparator, the second latch is further configured to generate the pulse signal to operate the switch network to alternate which one of the first terminal and the second terminal is coupled to the node.

According to another embodiment, the switch network is a Double-Pull Double-Throw (DPDT) switch network comprising a first switch pair configured to selectively couple the first terminal of the capacitor to the node and the second terminal of the capacitor to the second reference voltage in a first mode of operation, and a second switch pair configured to selectively couple the second terminal of the capacitor to the node and the first terminal of the capacitor to the second reference voltage in a second mode of operation, wherein the pulse signal generated by the second latch in response to receiving the output signal at the first level from the comparator is configured to operate the DPDT switch network to alternate between the first mode of operation and the second mode of operation. In one embodiment, the second reference voltage has a value that is half of a value of the first reference voltage.

According to one embodiment, the current to frequency converter further comprises a second inverter coupled between the second latch and the second switch pair, wherein the second inverter is configured to invert the pulse signal from the second latch and provide an inverted pulse signal to the second switch pair. In one embodiment, the first switch pair includes a first pair of transmission gates (T-gates) and the second switch pair includes a second pair of transmission gates (T-gates). In another embodiment, the DPDT switch network further comprises a first delay circuit coupled between the first switch pair and the second latch and a second delay circuit coupled between the second switch pair and the second inverter, wherein the first delay circuit and the second delay circuit are configured to ensure that the first mode of operation and the second mode of operation are mutually exclusive.

According to another embodiment, wherein the second latch is further configured to be coupled to a digital counter of a digital pixel and to provide the pulse signal to the digital counter.

Another aspect is directed to a method of converting photo-current to frequency comprising receiving, at a node coupled to a photodetector, photo-current generated by the photodetector in response to light incident on the photodetector, accumulating electrical charge from the photo-current on a first terminal of a capacitor coupled to the node, comparing a voltage on the first terminal of the capacitor with a first reference voltage, and in response to a determination that the voltage on the first terminal of the capacitor exceeds the first reference voltage, disconnecting the first terminal of the capacitor from the node, connecting the second terminal of the capacitor to the node, and accumulating electrical charge from the photo-current on the second terminal of the capacitor.

According to one embodiment, the method further comprises further in response to a determination that the voltage on the first terminal of the capacitor exceeds the first reference voltage, disconnecting the second terminal of the capacitor from a second reference voltage and connecting the first terminal of the capacitor to the second reference voltage. In one embodiment, the method further comprises comparing a voltage on the second terminal of the capacitor with the first reference voltage, and in response to a determination that the voltage on the second terminal of the capacitor exceeds the first reference voltage, disconnecting the second terminal of the capacitor from the node, reconnecting the first terminal of the capacitor to the node, and accumulating electrical charge from the photo-current on the first terminal of the capacitor.

According to another embodiment, the method further comprises coupling the node to the second reference voltage, with a reset switch, in a reset mode of operation, and opening the reset switch to start accumulating the electrical charge on the first terminal of the capacitor. In one embodiment, the method further comprises delaying the connection of the second terminal of the capacitor to the node to prevent the first terminal of the capacitor and the second terminal of the capacitor from both coupled to the node at the same time. In another embodiment, the method further comprises generating a pulse signal based on comparing the voltage on the first terminal of the capacitor with the first reference voltage, the pulse signal corresponding to an intensity of the light incident on the photodetector, wherein disconnecting the first terminal of the capacitor from the node includes pro-viding the pulse signal to a switch network to disconnect the first terminal of the capacitor from the node, and wherein connecting the second terminal of the capacitor to the node includes providing the pulse signal to the switch network to connect the second terminal of the capacitor to the node. In one embodiment, the method further comprises providing the pulse signal to a digital counter of a digital pixel.

One aspect is directed to a digital pixel comprising a photodiode configured to generated photo-current in response to light incident on the photodiode, a current to frequency converter coupled to the photodiode and configured to receive the photo-current and generate an output signal corresponding to an intensity of the light incident on the photodiode, and a digital counter configured to generate a digital representation of the intensity of the light incident on the photodiode based on the output signal, wherein the current to frequency converter includes self-referencing means for generating the output signal based on the photo-current.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
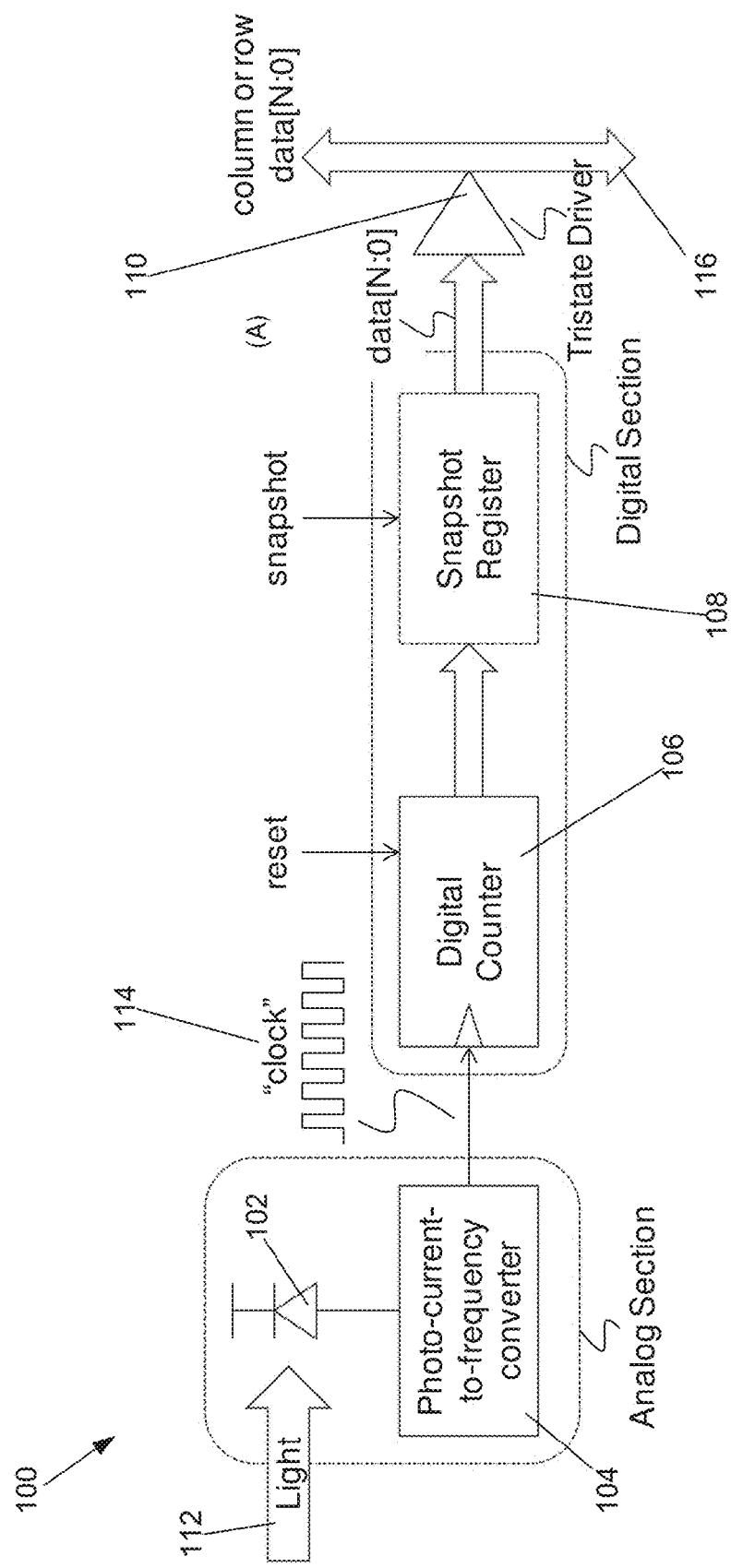
FIG. 1 is a block diagram illustrating one embodiment of a digital pixel according to aspects of the invention.

Traditional in-pixel ADC imagers suffer from a variety of limitations. For example, as a reset event of a traditional in-pixel ADC imager is occurring (i.e., the integration capacitor within the imager is discharging), the integration capacitor is not integrating photo current. At high (e.g., maximum) values of photo-current, the error term associated with not integrating the photo-current during a reset event increases and may limit the accuracy of the in-pixel ADC imager.

Another drawback of traditional in-pixel imagers is that as semiconductor technology improves, creating a reset pulse width sufficient to fully discharge the integration capacitor becomes more difficult. For example, creating a necessary reset pulse width in deep submicron (e.g. 28 nm) Complementary Metal-Oxide-Semiconductor (CMOS) technology is more difficult than in older (e.g., 180 nm CMOS) technology. A primary problem is that with improved semiconductor technology, gate speeds are increased with smaller gates, making it more difficult to create a wide enough pulse to fully reset the integration capacitor. Cascaded chains of gates are commonly used to create a wide pulse; however, this may lead to issues in increased power consumption, digital switching noise in the supplies, wider variations in pulse width, and increased noise. As more gates are cascaded to produce a wider pulse, the noise term associated with reset pulses blocking integration current is further increased.

If the chain of cascaded gates is limited to reduce related problems discussed above, the feedback loop within the imager can exhibit other stability problems. For example, in deep submicron technologies, the gates can be so fast that the integration capacitor only partially depletes during a reset event, increasing the feedback frequency of the imager and resulting in instability and potential "fibrillation" (e.g., an unstable or "stuck" pixel).

Accordingly, a current to frequency converter using a switched capacitor is provided that leverages the faster gate speeds of deep submicron CMOS to its advantage. The current to frequency converter uses the master of a Master-Slave (MS) Flip Flop (FF) and a Double-Pole, Double-Throw (DPDT) switch network to control the polarity of the integration capacitor. At each crossing of a reference charge level on the capacitor, the MS FF toggles and flips the DPDT switch network, thereby reversing both terminals of the integration capacitor, which in turn returns the DPDT switch network to its nominally stable integration condition. By automatically reversing the integration capacitor when the reference charge level is crossed, standard asynchronous reset mechanisms used in the current-to-frequency production of typical in-pixel imagers are not required and the problems associated with reset pulse widths and reset noise are eliminated. Increasing the gate speed of the current to frequency converter may improve the performance of the converter unlike conventional reset mechanisms in which performance degrades with increasing gate speed. In addition, there is no reset associated discharge current and the circuit continues to integrate during the switching event.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIG. 1 is a block diagram illustrating one embodiment of a digital pixel 100 according to aspects of the invention. The digital pixel 100 includes a photo-diode 102, a current-to-frequency converter 104, a digital counter 106, a snapshot register 108, and a tri-state driver 110. The photo-diode 102 is coupled to the converter 104. The converter 104 is also coupled to the digital counter. The snapshot register 108 is coupled to the digital counter 106 and the tri-state driver 110. The tri-state driver is coupled to an image processor.

As light 112 is incident on the photo-diode 102, current based on the intensity of the light 112 is provided from the photo-diode 102 to the current-to-frequency converter 104.

The converter 104 generates a pulsed clock signal 114 having a frequency based on the intensity of the light 112. The digital counter 106 counts the number of pulses in the clock signal 114 over a period of time. Each frame, a digital representation of the number of pulses counted by the digital counter 106 is copied to the snapshot register 108. The digital representation of the number of pulses counted by the digital counter 106 is then provided to the image processor via the tri-state driver 110. According to one embodiment, the digital pixel 100 is one of a plurality of pixels in a row or column of a focal plane array. The image processor receives digital counter values 116 from each digital pixel in the same column or row, and utilizes the digital counter values to generate an image. Operation of the current-to-frequency converter 104 is discussed in greater detail below with reference to FIGS. 2 and 3.

Figure 2:
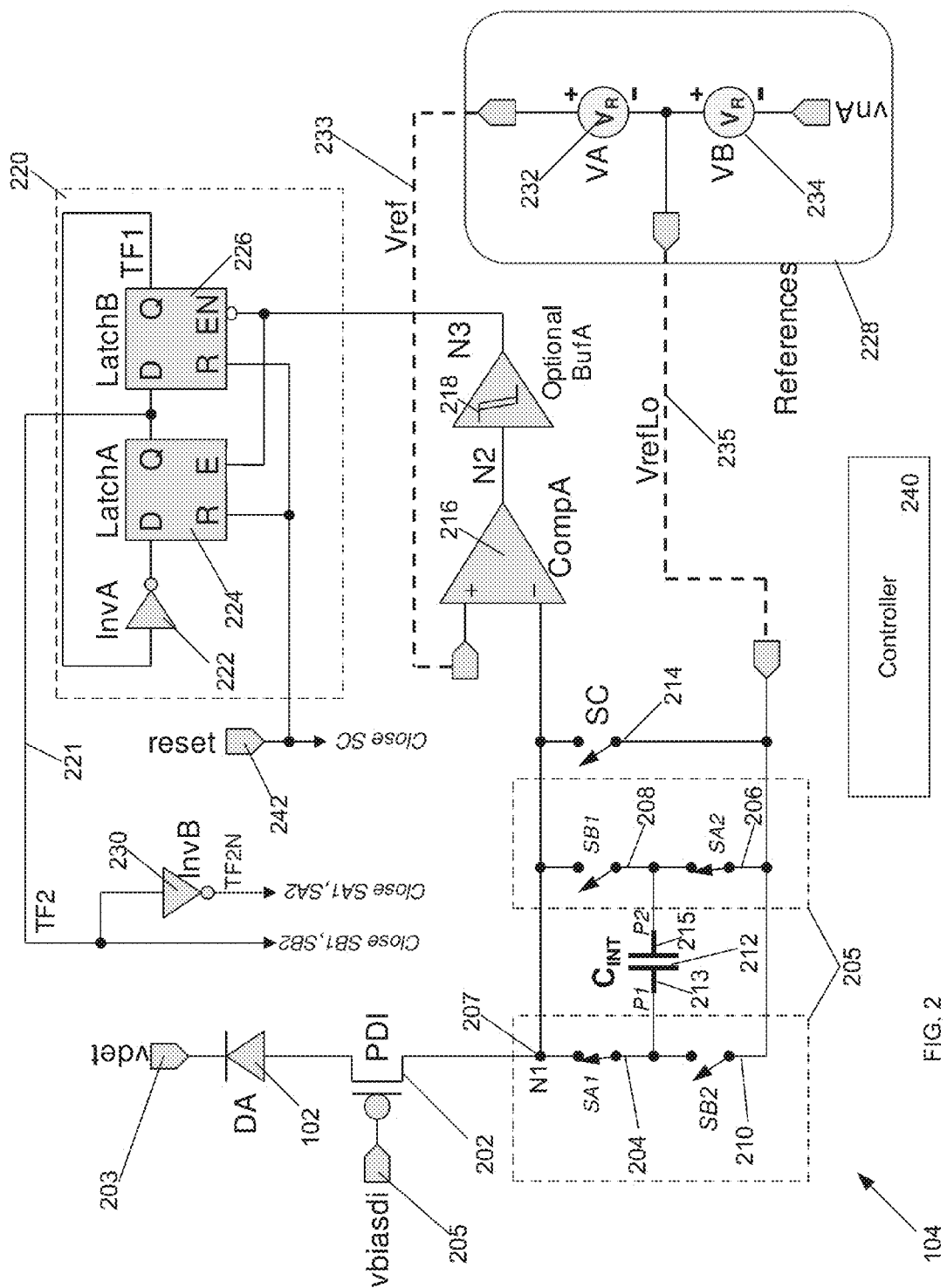
FIG. 2 is a block diagram illustrating one embodiment of a current to frequency converter according to aspects of the invention.

FIG. 2 is a block diagram illustrating one embodiment of a current to frequency converter 104 according to aspects of the invention. The converter 104 includes a Direct Injection (DI) "gate" transistor 202, a plurality of switches (SA1 204, SA2 206, SB1 208, SB2 210) that together make up a DPDT switch network 205, an integrating capacitor ($C_{NT}$) 212, a reset switch (SC) 214, an operational amplifier (CompA) 216, a toggle MS FF 220, and a voltage reference 228. According to one embodiment, the toggle MS FF 220 includes a first inverter (InvA) 222, a first Latch (LatchA) 224, and a second Latch (LatchB 226). The converter 104 also includes a second inverter (InvB) 230. In one embodiment, the latches 224, 226 are D-type latches; however, in other embodiments, any other appropriate latches may be utilized.

The photo-diode 102 is coupled between a detector voltage source (vdet) 203 and the transistor 202. A bias voltage source (vbiasdi) 205 is coupled to the gate of the transistor 202. In one embodiment, the transistor 202 is a p-Channel Field-Effect-Transistor (PFET); however, in other embodiments, the transistor 202 may be any other appropriate type of transistor. Also, in other embodiments, any other appropriate connection topology for connecting a photo-diode may be utilized.

A terminal of the transistor 202, the DPDT switch network 205, and the negative terminal of the operational amplifier 216 are coupled together at node N1 207. A first terminal of switch SA1 204, a first terminal of switch SB1 208, and a first terminal of switch SC 214 are coupled together at node N1 207. A second terminal of switch SA1 204 and a first terminal of switch SB2 210 are coupled to a first terminal (P1) 312 of the capacitor 212. A second terminal of switch SB1 208 and a first terminal of switch SA2 206 are coupled to a second terminal (P2) 215 of the capacitor 212. A second terminal of switch SB2 210 and a second terminal of switch SA2 206 are coupled to a second terminal of switch SC 214.

Switches SA1 204 and SA2 206 act as a pair and are both open or both closed at any given time. Switches SB1 208 and SB2 210 act as a pair and are both open or both closed at any given time. Switch pair SA1/SA2 works oppositely (or in a complimentary fashion) to switch pair SB1/SB2. That is, if switch pair SA1/SA2 is closed, then switch pair SB1/SB2 is open. Conversely, if switch pair SA1/SA2 is open, then switch pair SB1/SB2 is closed. In this manner, the switch pairs effect a Double-Pole, Double-Throw (DPDT) switch.

According to one embodiment, the voltage reference 228 includes a first voltage source (VA) 232 and a second voltage source (VB) 234. A positive terminal of the first voltage source 232 is coupled to the positive terminal of the operational amplifier 216 and is configured to provide a first reference voltage (Vref) 233 to the positive terminal of the operational amplifier 216. The negative terminal of the first voltage source 232 is coupled to a positive terminal of the second voltage source 234. The negative terminal of the first voltage source 232 and the positive terminal of the second voltage source are also coupled to the second terminal of switch SC 214 and are configured to provide a second reference voltage (VrefLo) 235 to the DPDT switch network 205 and switch SC 214. According to one embodiment, the first reference voltage (Vref) 233 is approximately twice the value as the second reference voltage (VrefLo) 235. For example, in one embodiment, the first reference voltage (Vref) 233 is around 500 mV and the second reference voltage (VrefLo) 235 is around 250 mV; however, in other embodiments, the first reference voltage and second reference voltage may be configured differently. Also, in other embodiments, the voltage reference 228 may be configured in any other way appropriate to generate the first reference voltage 233 and the second reference voltage 235.

An output of the operational amplifier 216 is coupled to the MS FF 220. In one embodiment (e.g., as shown in FIG. 2), the converter 104 also includes a buffer (BufA) 218 and the amplifier 216 is coupled to the MS FF 220 via the buffer 218. In one embodiment, the buffer 218 is inverting; however, in other embodiments, a different type of buffer may be utilized.

An output of the buffer 218 is coupled to the enable input (E) of the first latch 224. The output of the buffer 218 is also inverted and coupled to the enable input (EN) of the second latch 226. A reset line 242 from a controller 240 is coupled to the reset input (R) of the first latch 224 and the reset input (R) of the second latch 226. The reset line 242 is also coupled to switch SC 214. The data input (D) of the second latch 226 is coupled to the latch output (Q) of the first latch 224. The latch output (Q) of the second latch 226 is coupled to an input of the first inverter 222. An output of the first inverter 222 is coupled to the data input (D) of the first latch 224. The latch output (Q) of the first latch 224 is also coupled to the switch SA1 204, the switch SA2 206, and an input of the second inverter 230. An output of the second inverter 230 is coupled to the switch SB1 208 and the switch SB2 210.

The state of the SA1/SA2 switch pair and the SB1/SB2 switch pair (i.e., in an open or closed state) is determined by an output signal (TF2) of the MS FF 220 (at the output 221 of the MS FF 220) and an inverted output signal (TF2N) of the MS FF 220. In one embodiment, the switch pair SA1/SA2 is closed if TF2 is logic low and open if TF2 is logic high. Conversely, the switch pair SB1/SB2 is open if TF2 is logic low and closed if TF2 is logic high. In other embodiments, the operation of the switch pairs may be configured to respond differently to the TF2 signal. For example, in another embodiment, the switch pair SA1/SA2 is closed if TF2 is logic high and open if TF2 is logic low. Conversely, the switch pair SB1/SB2 is open if TF2 is logic high and closed if TF2 is logic low.

The TF2 output signal is generated by the MS FF 220 to control the state of the DPDT switch network 205 based on charge stored on the integration capacitor 212 (i.e., the voltage at node N1 207). In one embodiment, the MS FF 220 is a positive edge triggered FF with respect to the output signal (N3) of the buffer 218; however, in other embodiments, the MS FF 220 may be some other appropriate type of FF.

Figure 3:
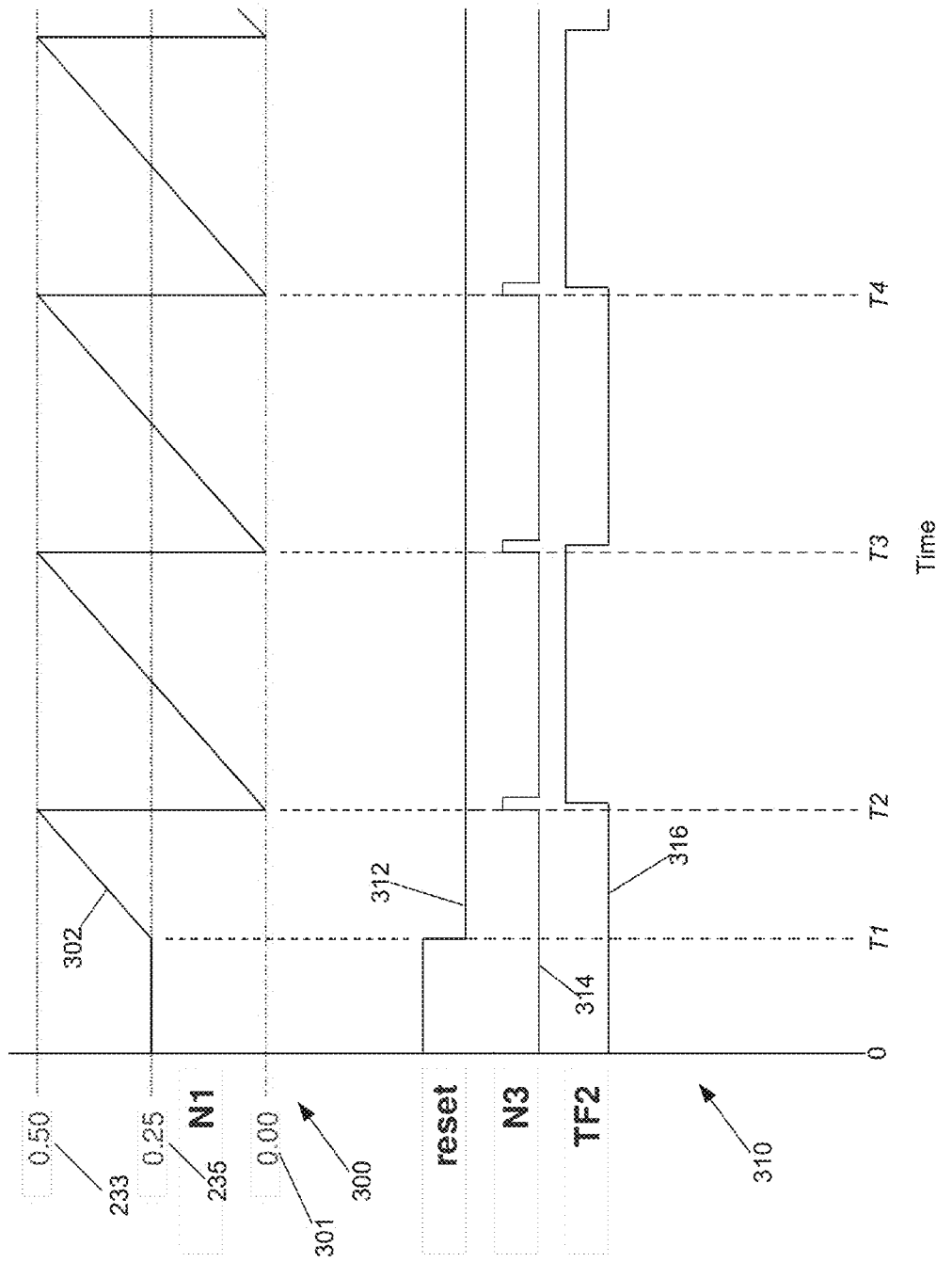
FIG. 3 shows timing diagrams illustrating operation of a current to frequency converter according to aspects of the invention.

FIG. 3 shows timing diagrams illustrating operation of the converter 104 according to certain embodiments. A first timing diagram 300 includes a trace 302 that represents voltage stored across the integration capacitor 212 (i.e., the voltage at node N1 207). A second timing diagram 310 includes a first trace 312 that represents a reset signal on the reset line 242, a second trace 314 that represents an output signal (N3) of the buffer 218, and a third trace 316 that represents a pulsed output signal (TF2) of the MS FF 220 (i.e., a pulsed output of the first latch 224).

In reference to FIG. 2, when the integration of light incident on the photo-diode is not desired, the converter 104 is placed into a reset mode of operation (e.g., from time 0 to time T1). In the reset mode of operation, a logic high reset signal 312 from the controller 240 is provided to the reset line 242 to close the reset switch 214. In the reset mode of operation (i.e., when the reset switch 214 is closed), the voltage 302 at node N1 207 is maintained at the second reference voltage (VrefLo) 235. Also in the reset mode of operation, the logic high reset signal 312 is provided to the reset inputs of the first latch 224 and the second latch 226 to force the latches 224, 226 to a null state (i.e., the output of the first latch 224 (i.e., TF2 316) to a logic low condition and the output of the second latch 226 to a logic low condition).

When the integration of light received by the photo-diode 102 is desired (e.g., at time T1), a low reset signal 312 from the controller 240 is provided to the reset line 242 and to the reset input of each latch 224, 226 at the beginning of a frame. The low reset signal opens the reset switch 214 and enables the outputs of the latches 224, 226. Once the reset switch 214 is opened (e.g., in response to a low reset signal at time T1), charge from the photo-diode, generated in response to light incident on the photo-diode 102, accumulates on a terminal of the integration capacitor 212 that is coupled to node N1 207.

The operational amplifier 216, operating as a comparator, compares the voltage 302 on node N1 207 to the first reference voltage (Vref) 233. The output of the comparator (N2) is high when the voltage 302 on node N1 207 is lower than the first reference voltage (Vref) 233 and low when the voltage 302 on node N1 207 is higher than the first reference voltage (Vref) 233. In one embodiment (e.g., as shown in FIG. 2), where an inverting buffer 218 is used, the output of the inverting buffer 218 (N3) is opposite to the output of the comparator (N2). In another embodiment, where a non-inverting buffer is utilized, the output 314 of the buffer 218 is the same as the output of the comparator (N2) and the enable input (E, EN) polarities of the first latch 224 and the second latch 226 are reversed. According to one embodiment, the optional buffer 218 provides signal hysteresis for improved operation.

When the reset switch 214 is first opened (e.g., at time T1), the voltage at node N1 207 is less than the first reference voltage (Vref) 233 (i.e., is at the second reference voltage (VrefLo) 235). Accordingly, the output of the comparator (N2) is high and the output 314 of the buffer 218 (N3) is low. The first latch 224 is disabled (via the low N3 at its enable input) and the second latch 226 is enabled (via the inverted N3 at its enable input). The first latch 224 outputs a logic low output signal (TF2) at its latch output (Q) as a result of asynchronous reset by the reset switch 214. The logic low output signal (TF2) is provided to the switch pair SB1/SB2 to open switches SB1 208 and SB2 210. The inverted output signal of the first latch 224 (i.e., logic high signal TF2N via the second inverter 230) is provided to the switch pair SA1/SA2 to close switches SA1 204 and SA2 206. Once enabled, the second latch 226 reads at its data input (D) the logic low output signal from the latch output (Q) of the first latch 224 and outputs a logic low output signal (TF1) at its latch output (Q). The logic low output signal (TF1) is inverted by the first inverter 222 and provided to the data input (D) of the first latch 224.

Once the switch pair SA1/SA2 is closed, the first terminal (P1) 213 of the integration capacitor 212 is coupled to node N1 207 and the second terminal (P2) 215 of the integration capacitor 212 is coupled to the second reference voltage (VrefLo) 235. Accordingly, at time T1, charge generated by the photo-diode begins to accumulate on the first terminal (P1) 213 of the integration capacitor 212 and the voltage at node N1 207 begins to increase, as shown in FIG. 3.

As charge accumulates on the first terminal (P1) 213 of the integration capacitor 212, the increasing voltage 302 on node N1 207 is compared by the operational amplifier 216 to the first reference voltage (Vref) 233. When the voltage 302 on node N1 207 exceeds the first reference voltage (Vref) 233 (i.e., at time T2), the output of the comparator (N2) goes low, the output 314 of the buffer 218 (N3) goes high, the first latch 224 is enabled (via the high N3 at its enable input), and the second latch 226 is disabled (via the inverted N3 at its enable input). Once enabled, the first latch 224 reads at its data input (D) the logic high signal from the first inverter 222 generated in response to the logic low signal (TF1) output by the second latch 226. In response to the logic high signal at its data input (D), the first latch 224 switches polarity and outputs a logic high output signal (TF2) 316. The logic high output signal (TF2) 316 is provided to the DPDT switch network 205 to toggle the condition of each switch pair to its opposite condition. For example, the logic high output signal (TF2) controls the switch pair SB1/SB2 to close and the inverted output of the first latch 224 (i.e., logic low signal TF2N via the second inverter 230) controls the switch pair SA1/SA2 to open.

Once the SA1/SA2 switch pair is open and the SB1/SB2 switch pair is closed, the second terminal (P2) 215 of the integration capacitor 212 is coupled to node N1 207 and the first terminal (P1) 213 of the integration capacitor 212 is coupled to the second reference voltage (VrefLo) 235. Consequently, the terminals of the integration capacitor (P1 213 and P2 215) are reversed, resulting in the voltage at node N1 207 dropping from the first reference voltage (Vref) 233 to a minimum value 301 equal to Vref-2*VrefLo. If Vref 233 is twice that of VrefLo 235, the minimum value 301 will ideally be close to 0 volts.

When the voltage at node N1 207 falls below Vref 233 (i.e., because the terminals of the integration capacitor 212 have been reversed), the output (N2) of the operational amplifier 216 returns to high and the output N3 314 of the buffer 218 goes low. Once N3 314 goes low, the first latch 224 is disabled (via the low N3 at the enable input) and the second latch 226 is re-enabled (via the inverted N3 at the enable input). Once enabled, the second latch 226 reads at its data input (D) the logic high latch output signal (i.e., logic high TF2 316 signal) from the first latch 224 which is maintained in a high logic condition and outputs a logic high latch output signal (TF1) to the first inverter 222. The first inverter 222 inverts the high latch output signal (TF1) from the second latch 226 and provides a logic low signal to the data input (D) of the first latch 224.

After time T2, when the second terminal (P2 215) of the integration capacitor 212 is coupled to node N1 207, charge accumulates on the second terminal (P2) 215 and the voltage at node N1 207 increases from the minimum voltage 301. When the voltage 302 on node N1 207 again exceeds the first reference voltage (Vref) 233 (i.e., at time T3), the output of the comparator (N2) goes low, the output 314 of the buffer 218 (N3) goes high, the first latch 224 is enabled (via the high N3 at its enable input), and the second latch 226 is disabled (via the inverted N3 at its enable input).

Once enabled, the first latch 224 reads at its data input (D) the logic low signal from the first inverter 222 generated in response to the logic high signal (TF1) output by the second latch 226. In response to the logic low signal at its data input (D), the first latch 224 switches polarity and outputs a logic low output signal (TF2) 316. The logic low output signal (TF2) 316 is provided to the DPDT switch network 205 to toggle the condition of each switch pair to its opposite condition. For example, the logic low output signal (TF2) controls the switch pair SB1/SB2 to open and the inverted output of the first latch 224 (i.e., logic high signal TF2N via the second inverter 230) controls the switch pair SA1/SA2 to close.

Once the SA1/SA2 switch pair is closed and the SB1/SB2 switch pair is opened, the first terminal (P1) 213 of the integration capacitor 212 is again coupled to node N1 207 and the second terminal (P2) 215 of the integration capacitor 212 is again coupled to the second reference voltage (VrefLo) 235. Consequently, the terminals of the integration capacitor (P1 213 and P2 215) are again reversed, resulting in the voltage at node N1 207 dropping from the first reference voltage (Vref) 233 to the minimum value 301 (e.g., approximately 0 volts).

When the voltage at node N1 207 falls below Vref 233 (i.e., because the terminals of the integration capacitor 212 have been reversed), the output (N2) of the operational amplifier 216 goes high and the output (N3 314) of the buffer 218 goes low. Once N3 314 goes low, the first latch 224 is disabled (via the low N3 at the enable input) and the second latch 226 is enabled (via the inverted N3 at the enable input). Once enabled, the second latch 226 reads at its data input (D) the logic low latch output signal (i.e., logic low TF2 316 signal) from the first latch 224 which is maintained in a low logic condition and outputs a logic low latch output signal (TF1) to the first inverter 222. The first inverter 222 inverts the low latch output signal (TF1) from the second latch 226 and provides a logic high signal to the data input (D) of the first latch 224.

As light continues to be incident on the photo-diode 102, charge will continue to accumulate on the integration capacitor 212, causing the MS FF 220 to alternate output polarities and the DPDT to toggle switch operation (i.e., to alternate which terminal of the capacitor 212 is coupled to node N1 207 and accumulating charge), as discussed above. The resulting output signal of the MS FF 220 (i.e., output signal TF2 316) is a pulse signal having a frequency which corresponds to the intensity of the light incident on the photo-diode 102. According to one embodiment, the TF2 signal 316 can be from the master latch of the least significant bit of a counter (e.g., counter 106 shown in FIG. 1).

Figure 4:
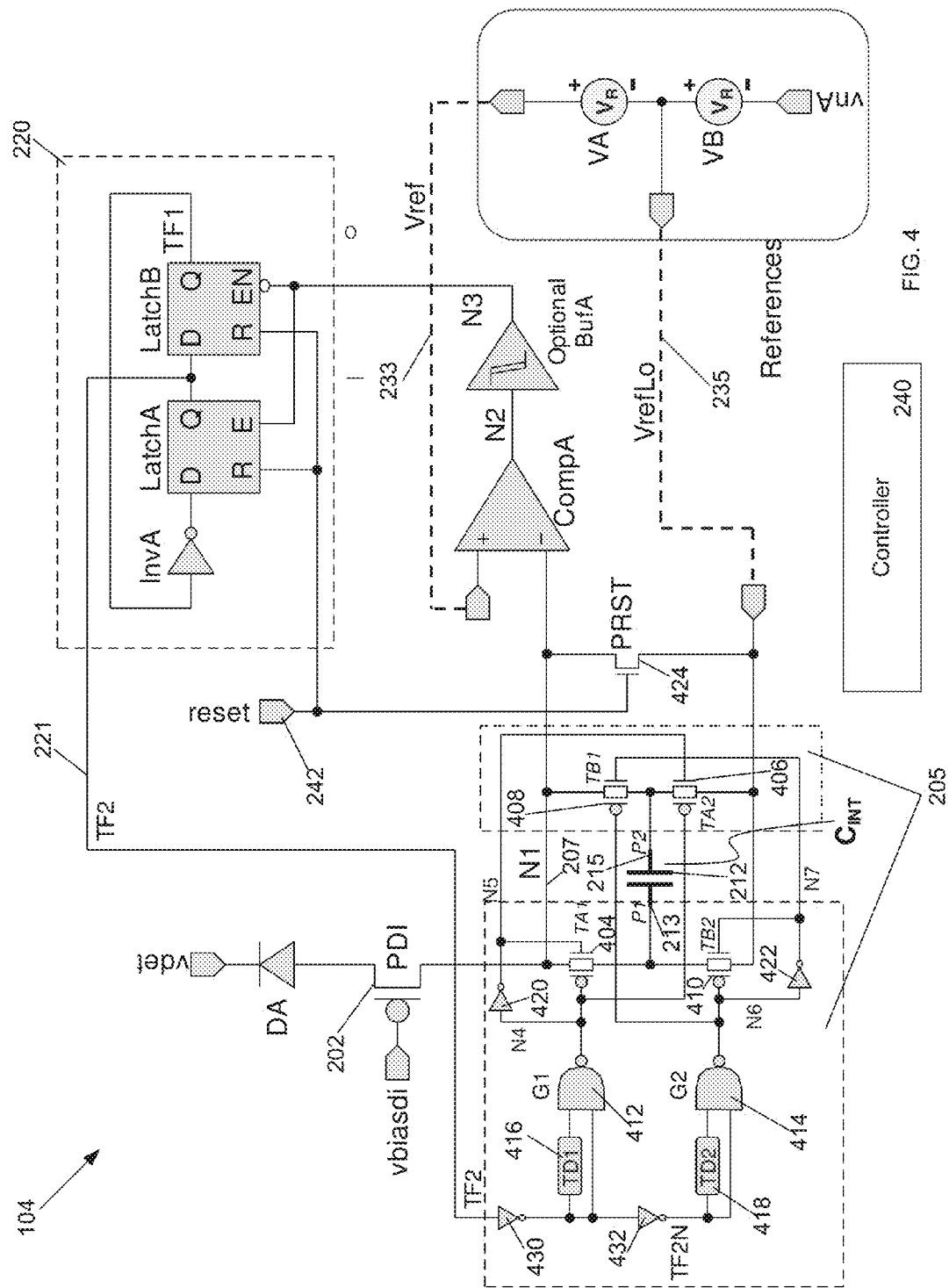
FIG. 4 is a schematic diagram illustrating one embodiment of a DPDT switch network according to aspects of the invention.

The DPDT switch network 205 is discussed in greater detail below with regard to FIG. 4 FIG. 4 is a schematic diagram illustrating one example of the DPDT switch network 205 according to certain embodiments. According to one embodiment, as shown in FIG. 4, the switches SA1 204, SA2 206, SB1 208, and SB2 2210, are implemented by using CMOS transistor combinations (e.g., CMOS Transmission gates (T-gates)). Switch SA1 204 is implemented with T-gate TA1 404, switch SA2 206 is implemented with T-gate TA2 406, switch SB1 208 is implemented with T-gate TB1 408, and switch SB2 210 is implemented with T-gate TB2 410. The DPDT switch network 205 further includes a first timing separation gate (G1) 412, a second timing separation gate (G2) 414, a first delay stage (TD1) 416, a second delay stage (TD2) 418, a first input inverter 430, a second input inverter 432, a first output inverter 420, and a second output inverter 422.

The output 221 of the MS FF 220 is coupled to an input of the first input inverter 430. An output of the first input inverter 430 is coupled to a first input of the first timing separation gate 412, an input of the first delay stage (TD1) 416, and an input of the second input inverter 432. The output of the first delay stage (TD1) 416 is coupled to a second input of the first timing separation gate 412. The output of the second input inverter 432 is coupled to a first input of the second timing separation gate 414 and an input of the second delay stage (TD2) 418. The output of the second delay stage (TD2) 418 is coupled to a second input of the second timing separation gate 414. An output of the first timing separation gate 412 is coupled to an inverted gate of T-gate TA1 404, to an input of the first output inverter 420, and to an inverted gate of T-gate TA2 406. An output of the first output inverter 420 is coupled to a gate of the T-gate TA1 404 and to a gate of the T-gate TA2 406. An output of the second timing separation gate 414 is coupled to an inverted gate of T-gate TB1 408, to an input of the second output inverter 422, and to an inverted gate of T-gate TB2 410. An output of the second output inverter 422 is coupled to a gate of the T-gate TB1 408 and to a gate of the T-gate TB2 410.

A first terminal of the T-gate TA1 404 and a first terminal of the T-gate TB1 408 are coupled to node N1 207. A second terminal of the T-gate TA1 404 is coupled to the first terminal (P1) 213 of the integration capacitor 212. A second terminal of the T-gate TB1 408 is coupled to the second terminal (P2) 215 of the integration capacitor 212. A first terminal of the T-gate TA2 406 is coupled to the second terminal (P2) 215 of the integration capacitor 212. A first terminal of the T-gate TB2 410 is coupled to the first terminal (P1) 213 of the integration capacitor 212. A second terminal of the T-gate TA2 406 and a second terminal of the T-gate TB2 410 are coupled to the second reference voltage (VrefLo) 235. As also shown in FIG. 4, according to one embodiment, the reset switch 214 is a transistor. For example, in one embodiment, the reset switch 214 is a Metal-Oxide-Semiconductor Field-Effect Transistor (MOSFET) 424 coupled between node N1 207 and the second reference voltage (VrefLo) 235 and having a gate coupled to the reset line 242. However, in other embodiments, the reset switch 214 may be any other appropriate type of switch.

The pulsed output signal (TF2) of the MS FF operates the DPDT switch network 205 (including the T-gates 404-410) to toggle which terminal of the integrating capacitor 212 is coupled to node N1 207 as similarly discussed above. The first timing separation gate (G1) 412, second timing separation gate (G2) 414, first delay stage (TD1) 416, second delay stage (TD2) 418, first output inverter 420, and second output inverter 422 effect a "break before make" logic circuit that prevents charge bleed off error due to T-gates being turned on simultaneously. For example, as long as the delays introduced by TD1 416 and TD2 418 are at least slightly larger than the delays of G1 412 (and its output inverter 420) and G2 414 (and its output inverter 422); when the TF2 signal transitions from one logic state to another, the "break before make" logic circuit ensures that the currently closed switch pair is opened before the currently open switch pair is closed.

As discussed above, traditional in-pixel imagers include reset circuits that must generate asynchronous reset pulses wide enough to fully discharge a corresponding integration capacitor and the generation of such reset pulses proves more difficult with increased gate speeds. For example, traditional in-pixel imagers typically include an integration capacitor coupled to a MOSFET which is configured to discharge the integration capacitor. The reset pulse provided to the MOSFET must be wide enough to fully discharge the integration capacitor. Accordingly, the width of the reset pulse must match the depletion time of the RC network created by the integration capacitor and the MOSFET. To generate the reset pulse having the proper width, it is common to utilize a string of cascaded gates (e.g., inverters). However, such cascaded gates introduce their own delay to the system. Accordingly, configuring the RC network and the cascaded gates to efficiently provide appropriate reset pulses to the MOSFET is difficult, especially when the gate speeds increase.

However, with the current to frequency converter 104 described above, the performance of the converter 104 actually improves as gate speeds increase. The converter 104 is a self-referencing system (i.e., not an asynchronous system like prior converters) that, while integrating photocurrent, is guaranteed to generate a pulse when the reversal of the integration capacitor terminals is required (i.e., when the voltage at node N1 207 exceeds the first reference voltage (Vref) 233). The faster the DPDT switch network 205 can toggle switch operation (i.e., alternate which terminal of the capacitor 212 is coupled to node N1 207) in response to the pulse, the more efficient and accurate the converter 104 is. By not utilizing a standard reset mechanism (e.g., a cascaded chain of gates), problems associated with such mechanisms in prior converters (e.g., increased power consumption, noise, feedback stability, and wide variations in pulse width), may be avoided. Simple delays corresponding to local logic gates (e.g., as described above with regard to FIG. 4) may be utilized to prevent charge bleed off error and to ensure that each terminal of the integration capacitor is discharged prior to the terminals of the capacitor being toggled. With the converter 104, the difficult to manage multi-variable delay based on an RC network time constant and the delay provided by a string of gates is not a concern.

For example, if the delay stages 416 and 418 are created by gate delays (e.g., as shown in FIG. 4 as two back-to-back inverters), multiple advantages may be realized. First, once a sufficient number of gates is determined (e.g., two or four inverters), the gates will track the speed of the transmission gates 404, 406, 408 and 410 over temperature, voltage, and process corners. Second, it eliminates the difficulty and uncertainty of prior art digital pixels wherein the full discharge of the integration capacitor was timed against a successive chain of gates. In such cases, it was not guaranteed that the integration capacitor value and reset switch resistance value (an RC time constant) would match the delay of a successive chain of gates over temperature, voltage, and process corners. Thus, if the delay stages 416 and 418 are created by gate delays, the converter will continue to operate as desired even as further improvements in technology increase gate speeds, because the break-before-make configuration will automatically track the transmission gate speeds.

Also, unlike traditional in-pixel imagers that stop integrating photo current during a reset event (e.g., as an integration capacitor within the imager is discharging), the current to frequency converter 104 does not stop integrating photo current. For example, when the DPDT switch network 205 is toggling switch operations (i.e., alternating which terminal of the capacitor 212 is coupled to node N1 207), other parasitic capacitances in the converter 104 (e.g., wires, transistors, etc) may continue to accumulate charge. When the toggling of switch operations is complete and terminals of the integration capacitor are reversed, charge sharing rebalances the charge on the integration capacitor. According to at least one embodiment, the converter 104 provides a 2× improvement in flux-to-frequency bandwidth.

As described above in one embodiment, the switches 204-210 of the DPDT network 205 are implemented with T-gates; however, in other embodiments, any other appropriate type of switches may be utilized. As also described above, upon opening of the reset switch, terminal P1 of the integration capacitor charges first; however in other embodiments, terminal P2 may be charged first upon opening of the reset switch.

As described above, a controller 240 is utilized to control when the converter 104 is integrating photo-current (e.g., by controlling the logic state of the reset line 242). Any appropriate type of controller 240 may be utilized. The controller 242 may also stop the converter 104 from integrating photo-current (and return the converter 104 to the reset mode of operation) by setting the reset line 242 to a logic high condition which in turn closes the reset switch 214. According to one embodiment, the controller 240 periodically closes the reset switch 214 (i.e., puts the converter 104 into the reset mode of operation), in order to reset the latches to a null state. For example, due to certain environmental conditions (e.g., radiation), a latch of the MS FF may inadvertently alter states, resulting in the converter 104 being unable to accurately integrate photo-current. If this condition goes uncorrected, the output of the converter will be unusable. By periodically resetting the latches (in the reset mode of operation) to a null state, the converter will ensure that even if an anomaly occurs, the effect of the anomaly will be minimized.

A self-referencing current to frequency converter using a switched capacitor is provided that leverages the faster gate speeds of deep submicron CMOS to its advantage. The current to frequency converter uses a capacitor and a DPDT switch network to control the master of a Master-Slave (MS) Flip Flop (FF). At each crossing of a reference charge level on the capacitor, the MS FF toggles and flips the DPDT switch network, thereby reversing both terminals of the integration capacitor which in turn returns the DPDT switch network to its nominally stable integration condition. By automatically reversing the integration capacitor when the reference charge level is crossed, standard reset mechanisms used in the current-to-frequency production of typical in-pixel imagers is not required and the problems associated with reset pulse widths and reset noise are eliminated. In fact, increasing the gate speed of the current to frequency converter actually improves the performance of the converter. In addition, there is no reset associated discharge current and the circuit continues to integrate during the switching event.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A current to frequency converter comprising:
a node configured to be coupled to a photodetector and to receive a photo-current from the photodetector;
a capacitor having a first terminal and a second terminal and configured to accumulate electrical charge derived from the photo-current on the first terminal and the second terminal;
a switch network configured to selectively couple one of the first terminal and the second terminal to the node;
a Master-Slave (MS) Flip Flop (FF) coupled to the switch network and configured to operate the switch network to toggle which of the first terminal and the second terminal is coupled to the node based on a voltage at the node, the MS FF including:
a first latch having an enable input, a data input, and a latch output,
a second latch having an inverted enable input, a data input, and a latch output, the latch output of the first latch coupled to the data input of the second latch and to the switch network, and
a first inverter coupled between the latch output of the second latch and the data input of the first latch;
a voltage reference configured to generate a first reference voltage; and
a comparator coupled to the node, the voltage reference, the enable input of the first latch, the inverted enable input of the second latch, and the MS FF, wherein the comparator is configured to compare the voltage at the node with the first reference voltage, provide an output signal at a first level to the MS FF in response to a determination that the voltage at the node exceeds the first reference voltage, and provide the output signal at a second level to the MS FF in response to a determination that the voltage at the node is less than the first reference voltage,
wherein the second latch of the MS FF is configured to generate a pulse signal at its latch output based on the output signal received from the comparator, the pulse signal having a frequency corresponding to an intensity of light incident on the photodetector.

2. The current to frequency converter of claim 1, further comprising a buffer coupled between the comparator and the MS FF.

3. The current to frequency converter of claim 1, further comprising a reset switch coupled between the node and the voltage reference and configured to be coupled to a controller via a reset line,
wherein the voltage reference is further configured to generate a second reference voltage, and
wherein the reset switch is further configured to selectively couple the node to the second reference voltage in a reset mode of operation.

4. The current to frequency converter of claim 3, wherein, in response to receiving the output signal at the first level from the comparator, the second latch is further configured to generate the pulse signal to operate the switch network to alternate which one of the first terminal and the second terminal is coupled to the node.

5. The current to frequency converter of claim 4, wherein the switch network is a Double-Pole Double-Throw (DPDT) switch network comprising:
a first switch pair configured to selectively couple the first terminal of the capacitor to the node and the second terminal of the capacitor to the second reference voltage in a first mode of operation; and
a second switch pair configured to selectively couple the second terminal of the capacitor to the node and the first terminal of the capacitor to the second reference voltage in a second mode of operation, wherein the pulse signal generated by the second latch in response to receiving the output signal at the first level from the comparator is configured to operate the DPDT switch network to alternate between the first mode of operation and the second mode of operation.

6. The current to frequency converter of claim 5, wherein the second reference voltage has a value that is half of a value of the first reference voltage.

7. The current to frequency converter of claim 5, further comprising a second inverter coupled between the second latch and the second switch pair, wherein the second inverter is configured to invert the pulse signal from the second latch and provide an inverted pulse signal to the second switch pair.

8. The current to frequency converter of claim 7, wherein the first switch pair includes a first pair of transmission gates (T-gates) and the second switch pair includes a second pair of transmission gates (T-gates).

9. The current to frequency converter of claim 8, wherein the DPDT switch network further comprises a first delay circuit coupled between the first switch pair and the second latch and a second delay circuit coupled between the second switch pair and the second inverter, wherein the first delay circuit and the second delay circuit are configured to ensure that the first mode of operation and the second mode of operation are mutually exclusive.

10. The current to frequency converter of claim 1, wherein the second latch is further configured to be coupled to a digital counter of a digital pixel and to provide the pulse signal to the digital counter.

11. A method of converting photo-current to frequency comprising acts of:
receiving, at a node coupled to a photodetector, photo-current generated by the photodetector in response to light incident on the photodetector;
accumulating electrical charge from the photo-current on a first terminal of a capacitor coupled to the node;
comparing a voltage on the first terminal of the capacitor with a first reference voltage;
generating, based on the act of comparing, an output signal at a first level in response to a determination that the voltage at the first terminal exceeds the first reference voltage;
generating, based on the act of comparing, the output signal at a second level in response to a determination that the voltage at the first terminal is less than the first reference voltage;
providing the output signal to an enable input of a first latch of a Master-Slave (MS) Flip Flop (FF) and to an inverted enable input of a second latch of a MS FF; and
in response to a determination that the voltage on the first terminal of the capacitor exceeds the first reference voltage, enabling the first latch with the output signal at the first level, and disabling the second latch with the output signal at the first level;
in response to the first latch being enabled, reading, at a data input of the first latch, a first output logic signal generated by an inverter coupled between a latch output of the second latch and the data input of the first latch;
in response to reading the first output logic signal at the data input of the first latch, transmitting a second output logic signal from a latch output of the first latch to a data input of the second latch and to a switch network coupled to the first and second terminals of the capacitor, the second output logic signal configured to operate the switch network to disconnect the first terminal of the capacitor from the node and connect the second terminal of the capacitor to the node; and
in response to disconnecting the first terminal of the capacitor from the node and connecting the second terminal of the capacitor to the node, accumulating electrical charge from the photo-current on the second terminal of the capacitor.

12. The method of claim 11, further comprising:
further in response to a determination that the voltage on the first terminal of the capacitor exceeds the first reference voltage, disconnecting the second terminal of the capacitor from a second reference voltage and connecting the first terminal of the capacitor to the second reference voltage.

13. The method of claim 12, further comprising:
comparing a voltage on the second terminal of the capacitor with the first reference voltage; and
in response to a determination that the voltage on the second terminal of the capacitor exceeds the first reference voltage, disconnecting the second terminal of the capacitor from the node, reconnecting the first terminal of the capacitor to the node, and accumulating electrical charge from the photo-current on the first terminal of the capacitor.

14. The method of claim 12, further comprising:
coupling the node to the second reference voltage, with a reset switch, in a reset mode of operation; and
opening the reset switch to start accumulating the electrical charge on the first terminal of the capacitor.

15. The method of claim 12, further comprising delaying the connection of the second terminal of the capacitor to the node to prevent the first terminal of the capacitor and the second terminal of the capacitor from both coupled to the node at the same time.

16. The method of claim 12, wherein transmitting the second output logic signal comprises generating the second output logic signal as a pulse signal based on comparing the voltage on the first terminal of the capacitor with the first reference voltage, the pulse signal corresponding to an intensity of the light incident on the photodetector,
wherein disconnecting the first terminal of the capacitor from the node includes providing the pulse signal to the switch network to disconnect the first terminal of the capacitor from the node, and
wherein connecting the second terminal of the capacitor to the node includes providing the pulse signal to the switch network to connect the second terminal of the capacitor to the node.

17. The method of claim 16, further comprising providing the pulse signal to a digital counter of a digital pixel.

18. A digital pixel comprising:
a photodiode configured to generated photo-current in response to light incident on the photodiode;
a current to frequency converter coupled to the photodiode and configured to receive the photo-current and generate a pulse signal corresponding to an intensity of the light incident on the photodiode; and
a digital counter configured to generate a digital representation of the intensity of the light incident on the photodiode based on the pulse signal,
wherein the current to frequency converter includes self-referencing means for generating an output signal based on the photo-current, and a Master-Slave (MS) Flip Flop (FF) coupled to the self-referencing means, the MS FF including:
a first latch having an enable input and a latch output;

a second latch having an inverted enable input and a latch output, the latch output coupled to a data input of the first latch and to the switch network; and a first inverter coupled between the latch output of the first latch and a data input of the second latch, wherein the second latch of the MS FF is configured to generate the pulse signal at its latch output based on the output signal received from the self-referencing means, the pulse signal having a frequency corresponding to an intensity of light incident on the photodetector.

* * * * *